United States Patent [19]
Danchin
[11] 4,271,343
[45] Jun. 2, 1981

[54] GAS-TIGHT MOLDED CASING FOR AN ELECTRICAL APPARATUS

[75] Inventor: Maxime Danchin, St. Egreve, France
[73] Assignee: Merlin Gerin, Grenoble, France

[21] Appl. No.: 43,036
[22] Filed: May 29, 1979
[30] Foreign Application Priority Data
Jun. 12, 1978 [FR] France ..... 78 18032
[51] Int. Cl.[3] ..... H01H 9/02; H05K 5/00
[52] U.S. Cl. ..... 200/304; 200/293; 220/88 A; 337/186
[58] Field of Search ..... 200/293, 304, 306; 220/88 A, 367, 372, 436; 428/911; 337/186; 150/52 H

[56] References Cited

U.S. PATENT DOCUMENTS 2,801,768 8/1957 Immel ..... 220/88 A
3,979,709 9/1976 Healey, Jr. ..... 337/186
4,141,460 2/1979 Stanistreet et al. ..... 220/88 A
4,149,649 4/1979 Szego ..... 220/88 A

FOREIGN PATENT DOCUMENTS 1440184 2/1969 Fed. Rep. of Germany .
2058148 5/1972 Fed. Rep. of Germany .
357781 12/1961 Switzerland .
538186 9/1972 Switzerland .

*Primary Examiner*—Willis Little
*Attorney, Agent, or Firm*—Stevens, Davis, Miller & Mosher

[57] ABSTRACT

A gas-tight molded casing of an electrical compressed gas circuit interrupter comprises a resilient and/or ductile sack shaped net embedded in the wall of the casing. The net is designed to retain the fragments of the exploded casing while permitting escapement of the compressed gas.

5 Claims, 4 Drawing Figures

I
III
10
12
14
16
18
20
22
24

GAS-TIGHT MOLDED CASING FOR AN ELECTRICAL APPARATUS

The present invention concerns a casing of an insulating molded synthetic resin, filled with a compressed gas such as sulfur hexafluorid (SF6) and containing electrical apparatus, more particularly a compressed gas circuit interrupter.

It is usual to install the circuit interrupter into a cubicle to eliminate the danger of an explosion, but there must of course be prevention of an explosion of the circuit interrupter casing outside its cubicle, for instance during its transportation where it could be dangerous. It can be prevented by increasing the wall thickness or bursting strength of the casings, which may result in intolerable dimensions and costs. Another approach to the problem is to prevent, according to the present invention, fractured parts or splinters from causing damages or injuries.

The object of the present invention is to provide a compressed gas filled molded casing capable of retaining splinters which result from the bursting of the casing.

In accordance with the invention, the synthetic resin casing includes a sack shaped net which is resilient or ductile capable of withstanding without fracturing the forces of an explosion, to retain the fragments of the casing and to allow escapement of the compressed gas.

Thermoplastics which are resilient or ductile such as polyethylene, polyvinyl chloride and polyamide have the required characteristics but it is clear that the structure of the woven or non-woven net may contribute to or confer the required elasticity.

The net in an insulating material is embedded in the wall of the casing and does not affect the dielectric strength or the gas tightness of the casing, but care should be taken that the meshes of the net do not bridge over the wall of the casing. The meshes of the net may be of various sizes, for instance a few millimeters or a fraction of a millimeter. The net is located in the mold and during the moulding the synthetic resin surrounds and comes through the meshes of the net to provide a good cohesion between the net and the molded case. The synthetic resin may be of epoxies, polyesters, polyurethanes, polymethacrylates or analogous resins.

Other advantages and features of the invention will become evident from the following description of an embodient of the invention, shown in the accompanying drawing in which FIG. 1 is an axial cross-section along the line I—I of FIG. 2, of an insulating casing of a circuit interrupter according to the present invention;

Figures 1, 2, 3, 4:
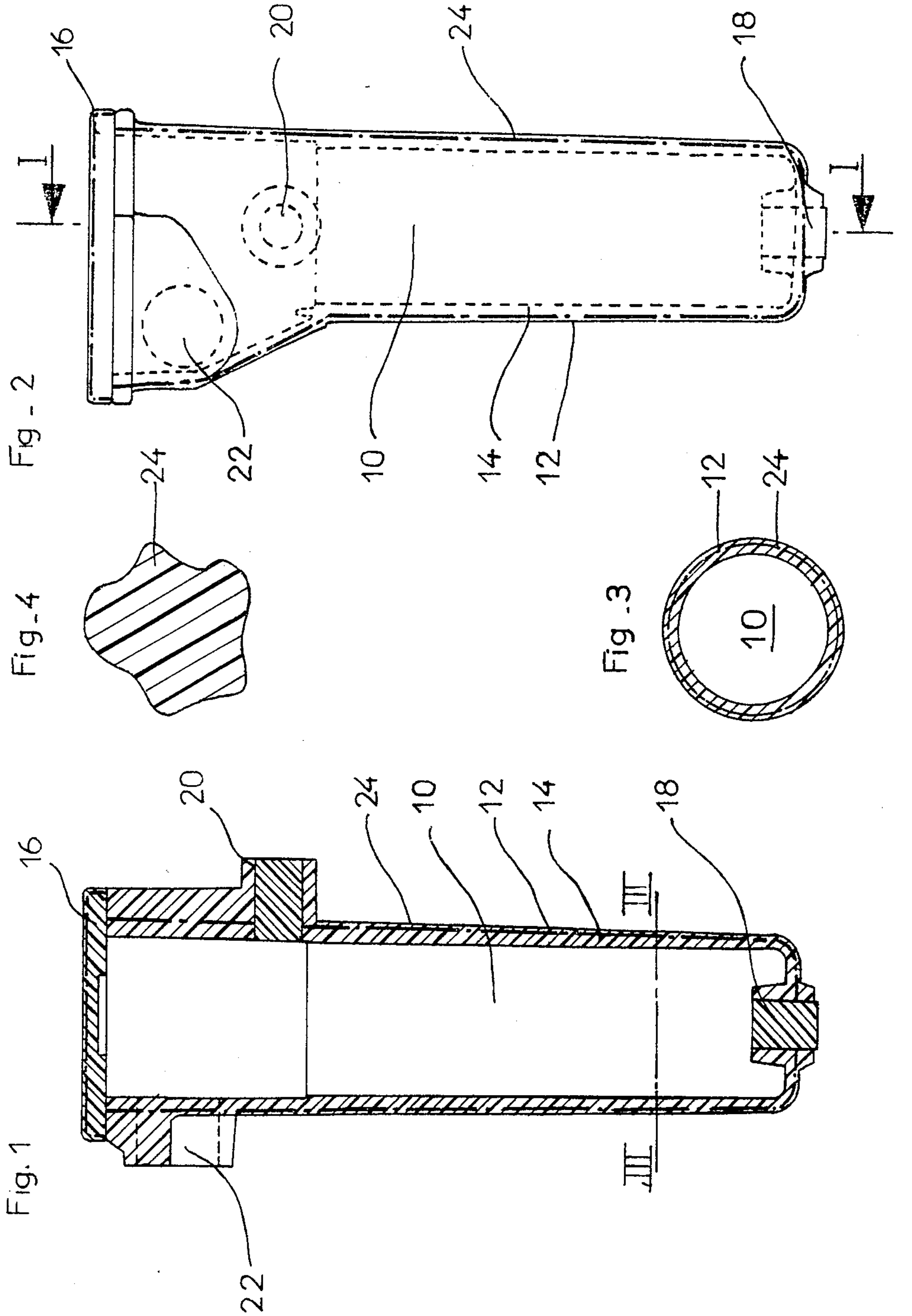
FIG. 2 is a side view of the casing shown in FIG. 1.
FIG. 3 is a section along the line III—III of FIG. 1.
FIG. 4 is a diagrammatic enlarged representation of a part of the net embedded in the casing.

The casing is of the kind more particularly described in U.S. Pat. No. 3,733,452, for a puffer type fluid circuit interrupter, but it is clear that the gas tight casing may be used for other applications, for instance for a circuit-breaker casing or a transformer casing. In the figures a casing 12 in two parts comprises a tubular part 14 of synthetic material molded in a single block and a removable cover 16 which permits the insertion and mounting of the elements of a circuit interrupter pole contained in the inner space 10 of the casing 12. The cover 16 closes the open base of the tubular part 14 and is gas-tight sealed in the factory. The casing 12 is filled with a compressed extinguishing gas, such as sulfur hexafluorid (SF6) for instance at a gas pressure of 3 bars. Inlet and outlet conductors 18, 20 are embedded in the side wall of the enclosure 14 and an actuating rod (not shown) is rotatably mounted in an opening 22 provided in the side wall.

In the wall of the tubular part 14 of casing 12 there is embedded a sack shaped net 24 which surrounds the space 10. The sack 24 is a filament woven fabric of thermoplastic insulating material which is resilient or ductile at the normal temperature. The filament or thread diameter falls within the range of 0.1 to 2 mm in accordance with the sizes of the casing and with the gas pressure value insides the casing. The resilient or ductile net is capable of withstanding the forces exerted by an exploding casing and to retain the fragments or splinters of the casing. The net is located in the mold before moulding of the casing and it has openings for the passage of the conductors 18, 20 and of the actuating rod. The net may be a woven or a non-woven fabric of a thermoplastic material, such as polyethylene, polyvinyl chloride, polyamide or linear polyester. The sizes of the meshes should fall within the range 0.4 to 6 millimeters.

The net does not prevent the compressed gas from escaping from an exploding casing but retains the fragments. A protection net may be included in the cover 16.

It is clear that the protection net does not prevent an explosion of the casing under the effect of a shock or of an accidental internal excess pressure and that the net is not designed to withstand forces resulting from an explosion under internal excess pressure which are much higher. Such an excess pressure can only occur during an interruption of short circuit currents and in that case the interrupter is enclosed in its cubicle, which is capable of withstanding these forces.

What is claimed is:

1. A gas-tight molded casing having a wall of an insulating molded synthetic resin for housing an electrical compressed gas apparatus comprising a sack shaped net, embedded in said wall, said net being of a resilient insulating material so designed as to retain the casing fragments in case of an accidental explosion of the casing under said compressed gas pressure and to allow the compressed gas to escape.

2. A gas-tight molded casing according to claim 1, wherein said net is of a resilient thermoplastic material.

3. A gas-tight molded casing according to claim 2, wherein said net is of a resilient thermoplastic material selected from the group consisting of polyolefins, polyvinyls, polyamides, linear polyesters.

4. A gas-tight molded casing according to claim 3, wherein said net is a woven fabric.

5. A gas-tight molded casing having a wall of insulating molded synthetic resin for housing an electrical compressed gas apparatus comprising a sack-shaped net embedded in said wall, said net being of a ductile insulating material so designed as to retain the casing fragments in case of an accidental explosion of the casing under said compressed gas pressure and to allow the compressed gas to escape.

* * * * *